United States Patent
Dunn et al.

(10) Patent No.: US 7,361,568 B2
(45) Date of Patent: Apr. 22, 2008

(54) EMBEDDED CAPACITORS AND METHODS FOR THEIR FABRICATION AND CONNECTION

(75) Inventors: Gregory J. Dunn, Arlington Heights, IL (US); Remy J. Chelini, Crystal Lake, IL (US); Robert T. Croswell, Hanover Park, IL (US); Philip M. Lessner, Newberry, SC (US); Michael D. Prevallet, Mauldin, SC (US); John D. Prymak, Greer, SC (US)

(73) Assignee: Motorola, Inc., Schaumburg, IL (US)

( * ) Notice: Subject to any disclaimer, the term of this patent is extended or adjusted under 35 U.S.C. 154(b) by 37 days.

(21) Appl. No.: 11/316,087

(22) Filed: Dec. 21, 2005

(65) Prior Publication Data
US 2007/0139864 A1    Jun. 21, 2007

(51) Int. Cl.
*H01L 21/20* (2006.01)
*H01L 29/00* (2006.01)
*H01L 23/48* (2006.01)
*H01G 4/005* (2006.01)

(52) U.S. Cl. ............... 438/381; 438/250; 257/532; 257/758; 257/773; 257/E21.008; 361/303

(58) Field of Classification Search ........ 361/303; 257/532, 758, 773, E21.008; 438/381, 250
See application file for complete search history.

(56) References Cited

U.S. PATENT DOCUMENTS

| | | | |
|---|---|---|---|
| 6,346,335 B1 | 2/2002 | Chen et al. | |
| 6,534,133 B1 * | 3/2003 | Kaloyeros et al. | 427/576 |
| 6,540,900 B1 | 4/2003 | Kinard et al. | |
| 6,605,314 B2 | 8/2003 | Lessner et al. | |
| 6,744,621 B2 | 6/2004 | Lessner et al. | |
| 6,808,615 B2 | 10/2004 | Lessner et al. | |
| 6,882,544 B2 | 4/2005 | Nakamura et al. | |
| 2004/0256731 A1 * | 12/2004 | Mao et al. | 257/773 |
| 2005/0150596 A1 * | 7/2005 | Vargo et al. | 156/324 |
| 2005/0217893 A1 | 10/2005 | Noguchi et al. | |
| 2006/0120014 A1 | 6/2006 | Nakamura et al. | |

* cited by examiner

*Primary Examiner*—Long K. Tran

(57) ABSTRACT

Embedded capacitors comprise a bimetal foil (500) that includes a first copper layer (205) and an aluminum layer (210) on the first copper layer. The aluminum layer has a smooth side adjacent the first copper layer and a high surface area textured side (215) opposite the first copper layer. The bimetal foil further includes an aluminum oxide layer (305) on the high surface area textured side of the aluminum layer, a conductive polymerlayer (420) on the aluminum oxide layer, and a second copper layer (535) overlying the aluminum oxide layer. The bimetal foil may be embedded in a circuit board (700) to form high value embedded capacitors.

5 Claims, 3 Drawing Sheets

EMBEDDED CAPACITORS AND METHODS FOR THEIR FABRICATION AND CONNECTION

FIELD OF THE INVENTION

The present invention relates generally to capacitors and more particularly to embedded capacitors.

BACKGROUND

For electronic equipment, small volume is a desirable attribute. Logic circuits have achieved small volume by being embodied in integrated circuits. However, achieving small volume for lumped elements such as resistors, capacitors, and inductors has proved more difficult, particularly for capacitors and inductors used at lower frequencies and higher currents. For many applications, capacitors of high capacitance values, such as those used for power supply and bypass filtering or low frequency coupling, are provided in the form of surface mounted packages.

A recent method for making small, high value surface mount capacitors is to use small strips of aluminum foil that are etched on both sides to have a very high surface area relative to a smooth surface. The etched aluminum strips are further processed by dipping processes that anodize the etched surfaces and coat the anodized surface with a conductive polymer. The anodizing forms a very thin dielectric, and the conductive polymer forms an opposing "plate" of the capacitor. The capacitors are then packaged by combining them in parallel, electrically, adding terminal leads, and molding into surface mountable packages. Such capacitors can have capacitances up to 100,000 times greater than conventional ceramic filled polymer embedded capacitors.

Such capacitors allow electronic equipment of reduced volume, but capacitors that occupy even less surface area of a printed circuit board are desirable.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate the embodiments and explain various principles and advantages, in accordance with the present invention.

Figure 1:
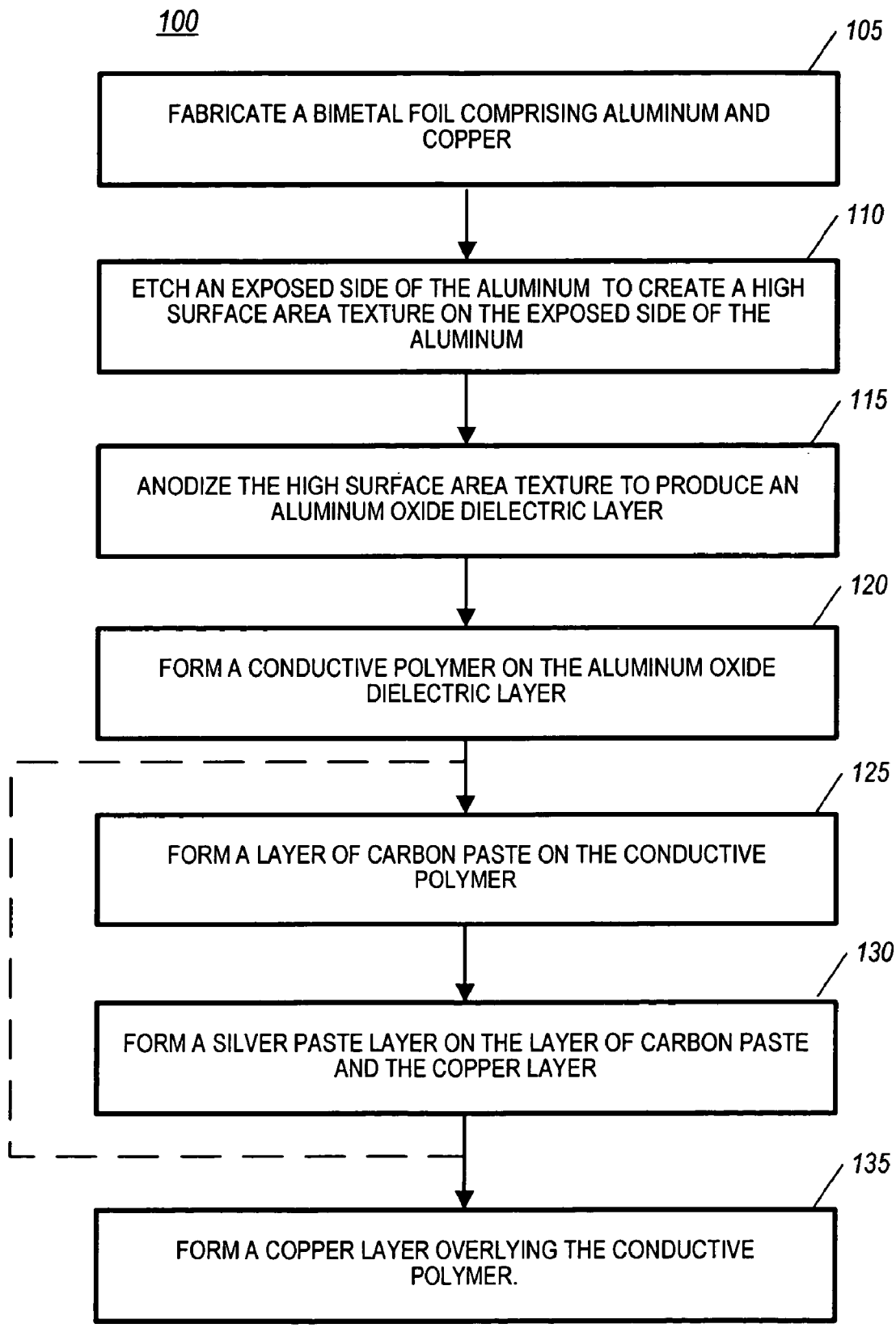
FIG. 1 is a flow chart that shows some steps of a method to fabricate a capacitive foil, in accordance with some embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before embodiments that are in accordance with the present invention are described in detail, it should be observed that the embodiments reside primarily in combinations of method steps and apparatus components related to embedded capacitors. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Figure 2:
FIGS. 2-5 are cross sectional views that show bimetal foils, in accordance with some embodiments of the present invention.
Figure 3:
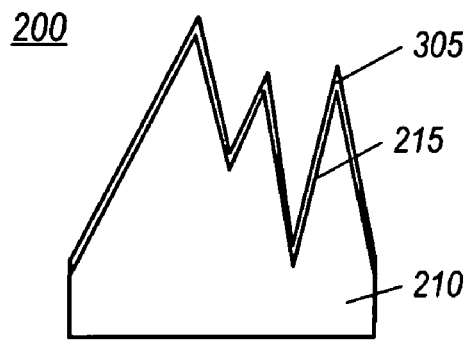
Figure 4:

Referring to FIG. 1, a flow chart 100 shows some steps of a method to fabricate a capacitive foil, in accordance with some embodiments of the present invention. The capacitive foil may be useful for fabricating embedded capacitors in a printed circuit board. Referring also to FIGS. 2, 3 and 4, cross-sectional views of the capacitive foil are shown at certain steps of the process described with reference to FIG. 1. At step 105 (FIG. 1), a unique bimetal foil 200 (FIG. 2) is fabricated that has a layer of aluminum 210 and a layer of copper 205. The aluminum layer 210 is etched on an exposed side at step 110 (FIG. 1) to create a high surface area texture 215 (FIG. 2) on the exposed side of the layer of aluminum. The bimetal foil 200 in this case is of a size useful for fabricating multilayer printed circuit boards, with a typical minimum size of 25 cm and a typical maximum size of 61 cm, although other sizes may be practical. The thickness of the copper layer before etching may be in the range of 10 µm to 70 µm, and the thickness of the aluminum layer may in the range of 20 µm to 110 µm. The high surface area texture 215 has a surface area gain, defined as surface area of the texture divided by the surface area of a flat surface of equivalent dimensions. The surface area gain is at least 10 and typically may be much larger, such as more than 100. Conventional etching techniques such as selective wet chemical or electrochemical etching may be used to etch the exposed side of the aluminum, without substantially affecting the copper layer, to achieve such surface area gains. Thus, the etching is performed substantially only on the exposed side of the layer of aluminum.

The high surface area texture 215 is then anodized at step 115 (FIG. 1), producing an aluminum oxide layer 305 (FIG. 3, an enlarged section of FIG. 2) that can form a dielectric layer of a capacitor. Conventional techniques, such as controlled bias wet chemical anodization, may be used to anodize the high surface area texture of the aluminum. The copper may be protected during this process with an inert resist or mask. The thickness of the aluminum oxide layer 305 is typically very small in comparison to the thicknesses of the aluminum layer 210 and copper layer 205. The aluminum oxide layer 305 may be, for example, in the range of 10 to 500 Angstroms. At this stage, the bimetal foil 200 could be packaged for shipment and distributed, such as by forming rolled or rectangular sheets.

At step 120 (FIG. 1) a conductive polymer layer is formed on the aluminum oxide dielectric layer. Referring to FIG. 4, the bimetal foil structure after the formation of the conductive polymer 420 is shown, in accordance with some embodiments of the present invention. A conductive polymer such as poly pyrrole or poly thiophene or derivatives thereof may be used, producing a layer that is from approximately 1 to 10 microns thick, having a conductance that may range from approximately 5 to 500 Siemens/cm. Poly(3,4-ethylenedioxythiophene), or PEDT is a particularly preferred conductive polymer because of its stability. The conductive polymer layer coats the anodized surfaces of the etched aluminum and forms a new surface 425, which may be formed to be approximately planar (as shown in FIG. 4), or may be substantially irregular. At this stage, the bimetal foil 400 could be packaged for shipment and distributed, such as by forming a roll or rectangular sheets.

Figure 5:
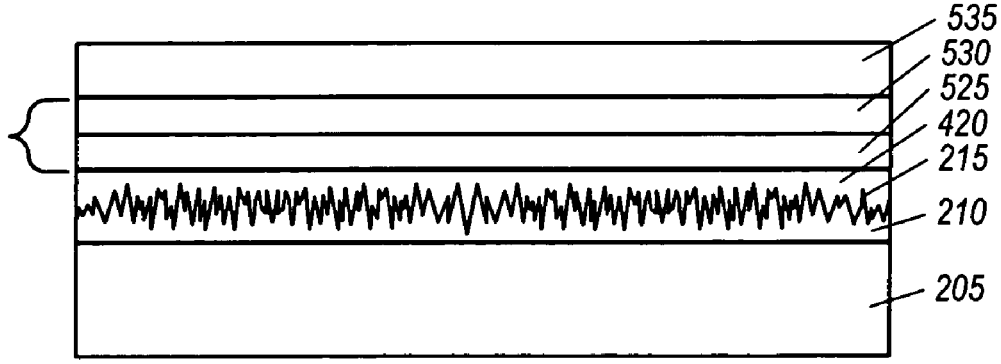

Referring to FIG. 5, a cross sectional view shows a bimetal foil having anode and cathode copper electrode layers, in accordance with some embodiments of the present invention. The bimetal foil 500 may be formed from the bimetal foil 400 by forming a layer of carbon paste 525 (FIG. 5) at step 125 on the conductive polymer and by forming a silver paste layer 530 (FIG. 5) on the layer of carbon paste at step 130 (FIG. 1). These layers 525, 530 are one means of providing a good base for adding a copper layer 535 (FIG. 5) by sputtering, electroless deposition, electroplating, lamination, or other means, that overlies the conductive polymer layer 420. In some embodiments, steps 125 and 130 may be eliminated, as indicated by the dotted path between steps 120 and 135 in FIG. 1. At this stage, the bimetal foil 500 could be packaged for shipment and distributed, such as by forming a roll or rectangular sheets, and is in a form that can easily be used by a fabricator of multilayer printed circuit boards to form patterns of conductive metallic interconnects to both plates of capacitors formed using the bimetallic foil 500.

Figure 6:
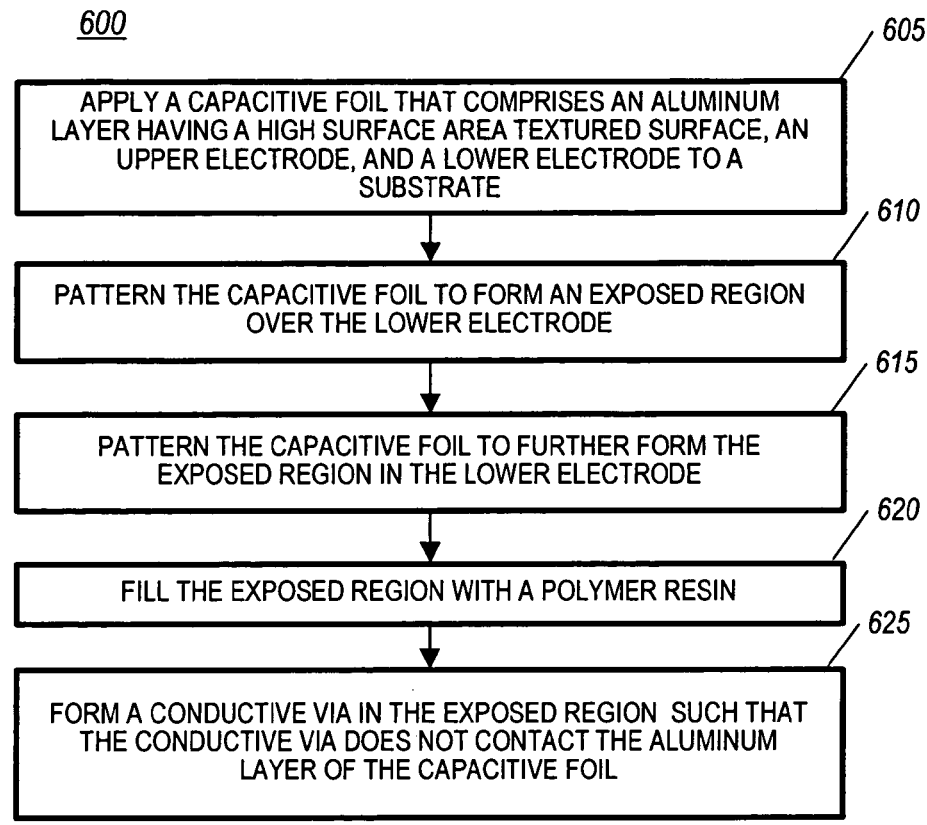
FIG. 6 is a flow chart that shows steps of a method for fabricating a printed circuit board, in accordance with some embodiments of the present invention.
Figure 7:
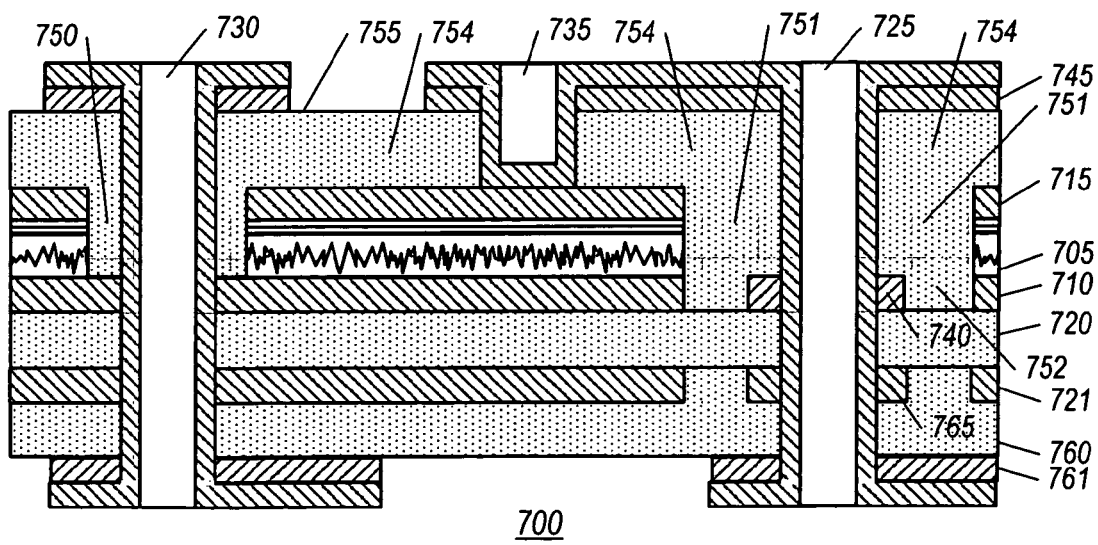
FIG. 7 is a cross sectional view of a portion of a printed circuit board, in accordance with some embodiments of the present invention.

Referring to FIG. 6, a flow chart 600 shows steps of a method for fabricating a printed circuit board, in accordance with some embodiments of the present invention. The steps described with reference to FIG. 6 may result in a printed circuit board, a portion 700 of which is illustrated by a cross sectional view shown in FIG. 7. At step 605 (FIG. 6) a capacitive foil, such as the bimetal foil 500 described above with reference to FIG. 5, that comprises an aluminum layer 705 having a high surface area textured side and a smooth side, a first copper layer adjacent the smooth side, and a second copper layer covering the textured side (with other layers optionally intervening), is applied (laminated) to a substrate layer 720. The high surface area textured side of the aluminum layer 705 has been anodized to form a very thin aluminum oxide layer thereon. The substrate layer 720 may be an inner or outer layer of printed circuit material, such as a layer of glass reinforced epoxy. The substrate layer may include a conductive layer 721, such as a copper layer, or the conductive layer 721 may be applied (laminated) after the capacitive foil is applied. Either one of the first and second copper layers may be applied to the substrate layer 720. The layer applied to the substrate will be referred to as the capacitive foil lower electrode; the other layer will be referred to as the capacitive foil upper electrode. In the example shown in FIG. 7, the first layer is applied to the substrate layer 720. In the example of FIG. 7, the capacitive foil lower electrode is layer 710 and the capacitive foil upper electrode is layer 715. Conventional techniques for laminating foil to a printed circuit substrate may be used to apply the capacitive foil to the substrate.

At step 610 (FIG. 6), the capacitive foil upper electrode 715, the aluminum layer 705 and all other layers but the capacitive foil lower electrode 710 are removed to form an exposed region over the capacitive foil lower electrode This may be accomplished by patterning the capacitive foil side of the structure, such as by using conventional lithography and etching techniques. In the example shown in FIG. 7, these openings are in regions 750, 751, with region 750 being approximately 500 microns in diameter and region 751 being approximately 900 microns in diameter.

Then the capacitive foil lower electrode 710 is patterned at step 615 (FIG. 6) as appropriate for features such as plated through holes which are to be electrically isolated from the capacitive foil, and plated through holes which are to be electrically connected to the capacitive foil lower electrode 710. The conductive metal foil of the substrate, which in this example is layer 721, may be patterned at substantially the same time, or in some embodiments, may have already been patterned. In FIG. 7, examples are shown of a plated through hole 725 which is electrically isolated from the capacitive foil and a plated through hole 730 which is electrically connected to the capacitive foil lower electrode, as well as a blind via 735, which is connected to the capacitive foil upper electrode 715. The patterning of the capacitive foil lower electrode 710 in this example removes material of the capacitive foil lower electrode 710 in region 751, further forming the region 752 into the capacitive foil lower electrode 710 to combine with region 751 to accommodate plated though hole 725, leaving a copper circle having a diameter of approximately 500 microns that forms a capture ring 740 when a hole for a via is formed through it A similar circle 765 is formed in the metal layer 721.

The exposed regions 750, 751, 752 and the areas above the exposed regions and above the capacitive foil upper electrode 754 are then filled with a polymer resin at step 620 (FIG. 6), which provides a planarized surface 755 upon which another layer of electrically conductive material, such as copper, may be formed. This filling with a polymer resin may be done by a conventional process, such as lamination of resin-coated foil (RCF) or prepreg. This is exemplified in FIG. 7 by layer 745. Another layer of polymer resin, such as layer 760, and another conductive layer, such as layer 761, may also be added at substantially the same time using conventional processes. The sizes of the exposed regions 750, 751 are chosen such that a conductive via formed later therein at step 625 (FIG. 6), such as by laser or mechanical drilling, does not expose the aluminum layer 705 of the capacitive foil at the edge of the via (in other words, the aluminum layer does not contact the via). This is advantageous because conductive vias are conventionally rendered conductive by plating them with a metal such as copper, and some metal (e.g., copper) plating chemistries will attack aluminum. Examples of conductive vias having this issue are conductive vias 725, 730 shown in FIG. 7. Conductive via 730 is a plated through hole electrically connecting nodes of the conductive layers 745, 761 to the capacitive foil lower electrode 710 and conductive layer 721, which may be a ground layer. In this example, the exposed region 750 may have a diameter of approximately 500 microns, and the hole formed for via 730 may have an outer diameter of 250 microns, allowing 125 microns of drill misregistration tolerance in any direction (i.e., typical misregistration conditions) without exposing the aluminum layer 705 of the capacitive foil. Conductive via 725 is a plated through hole that is electrically isolated from the capacitive foil, and electrically connects a node of conductive layer 745 to a node of electrical layer 761, as well as connecting to electrically isolated capture rings 740, 765. In this example, the exposed region 751 may have a diameter of approximately 900 microns, which is larger than the exposed region 750 to account for a clearance annulus outer diameter of approximately 700 microns and the capture ring diameter of approximately 500 microns.

Another conductive via 735, which is a blind via, is shown in FIG. 7 connecting a node of the conductive layer 745 to the capacitive foil upper electrode 715. Plated through hole 730 and blind via 735 are nodes that form the anode and cathode of an embedded capacitor having an aluminum oxide dielectric layer that has been formed on a high surface area textured side of the aluminum layer 705. It will be appreciated that a plurality of such capacitors can be thereby formed in an inner layer of a multilayer printed circuit board, or the entire layer of such a multilayer board could be one large capacitor, with vias passing thorough as necessary to interconnect other layers. It will be further appreciated that through hole via 730 contacting the capacitive foil lower electrode 710 could alternatively be a blind via, for example a 125-micron diameter laser blind via that would require an exposed region of approximately 250 microns (this example is not shown in FIG. 7).

It will be appreciated that the embedded capacitance that is provided by the embodiments of the present invention may range from 5 to 50 microfarads per $cm^2$, and may conveniently be used to provide power supply filtering, low frequency by-pass, and low frequency signal coupling in multilayer printed circuit boards without adding any significant surface area to the multilayer printed circuit board, thus increasing the volumetric circuit density of an electronic device.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

That which is claimed is:

1. A method for fabricating a printed circuit board, comprising:
    applying to a substrate a capacitive foil that comprises an aluminum layer having a high surface area textured side and a smooth side, an aluminum oxide dielectric layer on the high surface area textured side, wherein the aluminum and dielectric layers are disposed between two copper foil layers of which one copper layer is adjacent the substrate;
    patterning the capacitive foil to form an exposed region of the one copper layer that is adjacent the substrate;
    filling the exposed region with a polymer resin;
    forming a conductive via in the exposed region, wherein the conductive via does not contact the aluminum layer of the capacitive foil.

2. The method according to claim 1, further comprising patterning the one copper layer that is adjacent the substrate to further form the exposed region.

3. The method according to claim 1, wherein a size of the exposed region and a size of the conductive via are such that the conductive via does not contact the aluminum layer of the capacitive foil under typical misregistration conditions.

4. The method according to claim 1, wherein the one copper layer adjacent the substrate is the copper layer covering the textured side of the aluminum layer.

5. The method according to claim 1, wherein the conductive via is a blind via.

\* \* \* \* \*

UNITED STATES PATENT AND TRADEMARK OFFICE
CERTIFICATE OF CORRECTION

PATENT NO. : 7,361,568 B2
APPLICATION NO. : 11/316087
DATED : April 22, 2008
INVENTOR(S) : Gregory J. Dunn et al.

It is certified that error appears in the above-identified patent and that said Letters Patent is hereby corrected as shown below:

Title Page; should read;
(73) Assignee:   Motorola, Inc., Schaumburg Illinois (US)
                 KEMET Electronics Corporation, Greenville, South Carolina (US)

Signed and Sealed this

Twenty-fourth Day of March, 2009

JOHN DOLL
*Acting Director of the United States Patent and Trademark Office*